(12) United States Patent
Kadoi

(10) Patent No.: US 12,140,612 B2
(45) Date of Patent: Nov. 12, 2024

(54) CURRENT DETECTION DEVICE

(71) Applicant: ABLIC Inc., Tokyo (JP)

(72) Inventor: Kiyoaki Kadoi, Tokyo (JP)

(73) Assignee: ABLIC Inc., Nagano (JP)

( * ) Notice: Subject to any disclaimer, the term of this patent is extended or adjusted under 35 U.S.C. 154(b) by 134 days.

(21) Appl. No.: 18/180,105

(22) Filed: Mar. 7, 2023

(65) Prior Publication Data

US 2023/0288454 A1 Sep. 14, 2023

(30) Foreign Application Priority Data

Mar. 9, 2022 (JP) .............................. 2022-036547
Sep. 27, 2022 (JP) .............................. 2022-153271

(51) Int. Cl.
*G01R 15/20* (2006.01)
*G01R 19/00* (2006.01)

(52) U.S. Cl.
CPC ....... *G01R 15/207* (2013.01); *G01R 19/0092* (2013.01)

(58) Field of Classification Search
CPC ... G01R 1/203; G01R 15/146; G01R 19/0007
See application file for complete search history.

(56) References Cited

U.S. PATENT DOCUMENTS

| | | | |
|---|---|---|---|
| 2014/0210479 A1* | 7/2014 | Rink | G01R 31/3828 324/426 |
| 2018/0306842 A1* | 10/2018 | Fukunaka | H01L 24/85 |
| 2021/0011058 A1* | 1/2021 | Suzuki | G01R 15/202 |

FOREIGN PATENT DOCUMENTS

| | | |
|---|---|---|
| JP | 2002257866 | 9/2002 |
| JP | 2018179994 | 11/2018 |

* cited by examiner

*Primary Examiner* — Tung X Nguyen
(74) *Attorney, Agent, or Firm* — JCIPRNET

(57) ABSTRACT

A current detection device includes a main busbar and a semiconductor chip. A detected current flows through the main busbar. The semiconductor chip is spaced apart from the main busbar. The semiconductor chip includes a branch busbar, a detection part, and an output part. The branch busbar is connected in parallel with the main busbar. The detection part is arranged adjacent to the branch busbar and detects a first magnetic field generated based on a branch current flowing from the main busbar to the branch busbar. The output part calculates and outputs a current value based on the first magnetic field detected by the detection part.

9 Claims, 5 Drawing Sheets

CURRENT DETECTION DEVICE

CROSS-REFERENCE TO RELATED APPLICATION

This application claims the priority benefit of Japan application serial no. 2022-036547, filed on Mar. 9, 2022 and Japan application serial no. 2022-153271, filed on Sep. 27, 2022. The entirety of the above-mentioned patent applications is hereby incorporated by reference herein and made a part of this specification.

BACKGROUND

Technical Field

The present invention relates to a current detection device.

Related Art

A current detection device which detects a current flowing through a conductor such as a busbar of a circuit is known. The current detection device described in a related art includes a main busbar through which a non-detected current flows, a branch busbar branched from the main busbar, and a current sensor provided on the branch busbar. The current detection device described in the related art calculates the current value of the main busbar based on the current value flowing through the branch busbar. The current detection device described in another related art includes a busbar having a curved part and a magnetic sensor arranged on the inner side of the curved part. The current detection device described in the another related art calculates the current value of the busbar based on the detection value of the magnetic sensor.

The conductor such as a busbar through which a measurement target current flows is formed in various shapes according to the application and type of the electrical apparatus to which the conductor is attached, and the range of the measured current value also differs. According to the current detection devices described in the related arts, it is necessary to set the shape and the range of the detected current according to the electrical apparatus to which the conductor is attached, which may complicate the design process and manufacturing process.

SUMMARY

A current detection device according to an embodiment of the present invention includes a main busbar and a semiconductor chip. A detected current flows through the main busbar. The semiconductor chip is spaced apart from the main busbar. The semiconductor chip includes a branch busbar, a detection part, and an output part. The branch busbar is connected in parallel with the main busbar. The detection part is arranged adjacent to the branch busbar and detects a first magnetic field generated based on a branch current flowing from the main busbar to the branch busbar. The output part calculates and outputs a current value based on the first magnetic field detected by the detection part.

According to an embodiment of the present invention, it is possible to provide a versatile current detection device capable of measuring, with high accuracy, a current value of a measurement target through which a measured current flows, without being restricted by a configuration of the measurement target.

DESCRIPTION OF THE EMBODIMENTS

Embodiments of the present invention provide a versatile current detection device capable of measuring, with high accuracy, a current value of a measurement target through which a measured current flows, without being restricted by a configuration of the measurement target.

Figure 1:
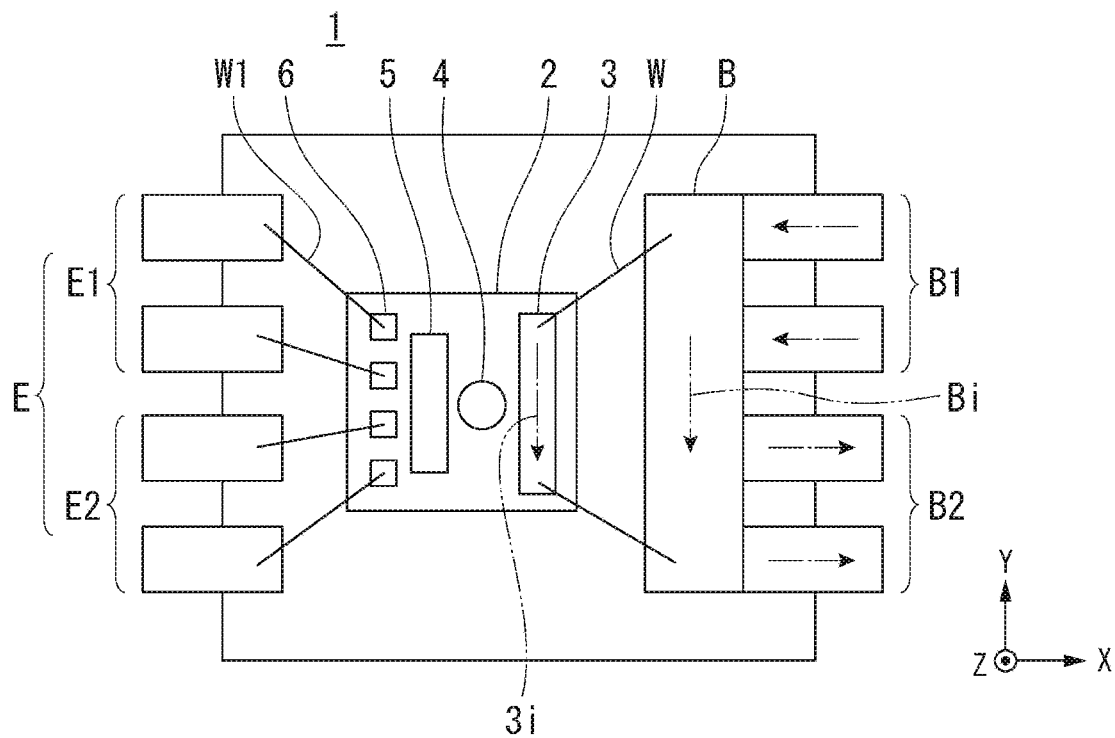
FIG. 1 is a plan view illustrating an example of a current detection device according to an embodiment.
Figure 2:
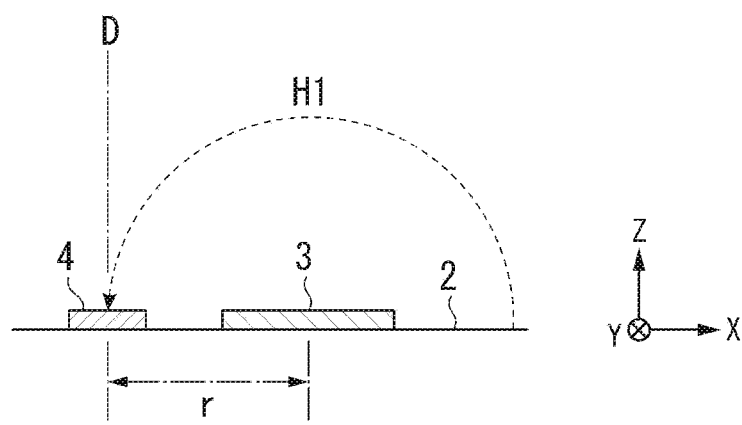
FIG. 2 is a circuit diagram illustrating an example of a detection part according to the embodiment.
Figure 3:
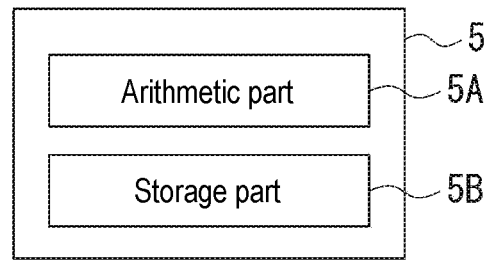
FIG. 3 is a block diagram illustrating an example of a configuration of an output part according to the embodiment.

As illustrated in FIG. 1 to FIG. 3, a current detection device 1 includes a main busbar B through which a detected current Bi flows, and a semiconductor chip 2 spaced apart from the main busbar B. The semiconductor chip 2 includes a branch busbar 3, a detection part 4 provided adjacent to the branch busbar 3, and an output part 5. This current detection device 1 branches a part of the detected current Bi flowing through the main busbar B by the branch busbar 3, and measures the detected current Bi flowing through the main busbar B by monitoring the branched current. In the drawings, XYZ axes orthogonal to each other are set for convenience of illustration.

The main busbar B is, for example, a conductor formed as a rectangular plate-shaped body. The main busbar B is formed of a metal member such as copper, brass, or aluminum. The main busbar B is, for example, a terminal member in a vehicle or the like through which a large detected current Bi flows. In the main busbar B, for example, a detected current Bi of ±several tens of amperes to ±1,000 amperes flows depending on the application. The main busbar B has a predetermined electrical resistance value (first resistance value). The main busbar B is provided with, for example, an input port B1 which receives a current and an output port B2 which outputs a current. In the current detection device 1, the branch busbar 3, the detection part 4, and the output part 5 on the semiconductor chip 2, and a part of the main busbar B are sealed with resin.

The semiconductor chip 2 is electrically connected in parallel with the main busbar B via electrical wirings W, for example. The branch busbar 3 provided separately from the main busbar B is arranged on the semiconductor chip 2. The branch busbar 3 is formed, for example, in a rectangular plate shape.

The branch busbar 3 has a predetermined electrical resistance value (second resistance value). The second resistance value is a value higher than the first resistance value. To ensure the detection performance of the detection part 4, the second resistance value is set so that overheating does not occur. For example, the second resistance value is adjusted so that a temperature propagated to the detection part 4 based on the amount of heat generated due to a branch current 3*i* flowing through the branch busbar 3 becomes lower than a temperature threshold value which ensures the detection performance of the detection part 4. In the branch busbar 3 and the main busbar B, a ratio between the first resistance value and the second resistance value may be adjusted by changing parameters such as thickness, length, and width in the shapes to arbitrarily adjust the magnitude of the branch current 3*i* flowing through the branch busbar 3.

The branch busbar 3 is electrically connected in parallel with the main busbar B via the electrical wirings W formed of, for example, metal wires. The electrical wiring W is a bonding wire formed of any one of metal materials of gold, copper, silver, and solder, or a combination of these metal materials. One end side of the branch busbar 3 is connected with one end side of the main busbar B on an input port B1 side via the electrical wiring W. Another end side of the branch busbar 3 is connected with another end side of the main busbar B on an output port B2 side via the electrical wiring W. The branch busbar 3 is electrically connected in parallel with the main busbar B, and is formed so that a branch current 3*i* proportional to the detected current Bi flows. The detection part 4 is arranged adjacent to the branch busbar 3. By forming both the branch busbar 3 and the detection part 4 on the surface of the semiconductor chip 2 by a semiconductor process, positional variations between the branch busbar 3 and the detection part 4 can be suppressed, so the current can be detected with high accuracy.

The detection part 4 is spaced apart from the branch busbar 3 by a predetermined distance r. The detection part 4 is, for example, a magnetic sensor which detects a first magnetic field H1 generated based on the branch current 3*i* flowing through the branch busbar 3. In the detection part 4, for example, a detection direction D of magnetic field is a normal direction (Z-axis direction) of the semiconductor chip 2 (surface). The detection part 4 is arranged adjacent to the branch busbar 3 and detects the first magnetic field H1 generated by the branch current 3*i*. By forming the branch busbar 3 and the detection part 4 on the surface (on a same plane) of the semiconductor chip 2, the first magnetic field H1 can be detected at a most sensitive position, so the current can be detected with high accuracy. The detection part 4 is formed of, for example, a Hall element. The detection part 4 may also be a magnetic sensor such as a tunnel magneto resistance (TMR) element other than the Hall element.

The detection part 4 detects, for example, a magnetic field in a direction along a predetermined direction (the Z-axis direction in the drawing). A posture and a position of the detection part 4 are adjusted to detect, for example, the concentric first magnetic field H1 generated around the branch busbar 3 through which the branch current 3*i* flows (see FIG. 2). Further, the main busbar B generates a second magnetic field based on the detected current Bi. The detection part 4 is arranged at a posture or a position which makes it difficult to detect the component of the second magnetic field in the detection direction of the first magnetic field H1.

Further, the predetermined distance r between the detection part 4 and the branch busbar 3 is set so that the amount of heat generated due to the branch current 3*i* does not affect the performance of the detection part 4. For example, the predetermined distance r is set to such a value that, if spaced apart by the predetermined distance r or more, the temperature propagated to the detection part 4 based on the amount of heat generated due to the branch current 3*i* becomes lower than the temperature threshold value which ensures the detection performance of the detection part 4. The arrangement of the detection part 4 will be described later. The detection part 4 transmits, to the output part 5, an electrical signal obtained by converting the magnetic field strength into a voltage value.

The output part 5 is arranged adjacent to the detection part 4. The output part 5 is electrically connected to the detection part 4 and receives an electrical signal corresponding to a detection value of the detection part 4. A plurality of electrode terminals 6 are provided on the semiconductor chip 2. The electrode terminals 6 receive and output electrical signals and signal power supplied to the detection part 4 and the output part 5. The plurality of electrode terminals 6 are electrically connected to an electrode part E via bonding wires W1, for example. The electrode part E includes, for example, a pair of signal electrodes E1 for receiving and outputting electrical signals, and a pair of power electrodes E2 for receiving and outputting power.

The output part 5 includes an arithmetic part 5A having an arithmetic function and a storage part 5B having a memory function (see FIG. 3). The arithmetic part 5A calculates the branch current 3*i* flowing through the branch busbar 3, for example, based on the detection value of the first magnetic field generated from the branch busbar 3 and an arithmetic formula for calculating the current. The arithmetic formula is stored in advance in the storage part 5B. The arithmetic formula includes a magnetic field strength arithmetic formula for converting an electrical signal of a detection value into a magnetic field strength, a branch current arithmetic formula for calculating a first current value of the branch current flowing through the branch busbar 3 based on the magnetic field strength and the predetermined distance r, and a detected current arithmetic formula for calculating a second current value of the detected current flowing through the main busbar B. The storage part 5B stores in advance data such as the first resistance value of the main busbar B, the second resistance value of the branch busbar 3, the predetermined distance r, etc. which are used in the arithmetic formula, for example.

The arithmetic part 5A calculates the magnetic field strength of the first magnetic field H1, for example, based on the detection value and the magnetic field strength arithmetic formula. A relationship $H=I/2r$ is present among the magnetic field strength H, the current value I, and the predetermined distance r, and the branch current arithmetic formula is expressed as $I=2rH$. The arithmetic part 5A calculates the first current value of the branch current based on the calculation result of the magnetic field strength of the first magnetic field H1, the data of the predetermined distance r, and the branch current arithmetic formula. Based on the calculated first current value, the second resistance value of the branch busbar 3, the first resistance value of the main busbar B, and the detected current arithmetic formula, the arithmetic part 5A calculates the detected current flowing through the main busbar B.

The storage part 5B is a memory having a predetermined memory capacity capable of holding the data. The storage part 5B stores in advance the magnetic field strength arithmetic formula, the branch current arithmetic formula, and the detected current arithmetic formula. Further, the storage part 5B stores, for example, the first resistance value of the main busbar B and the second resistance value of the branch busbar 3. The first resistance value and the second resistance value are measured, for example, by applying a test current of a predetermined value respectively to the main busbar B and the branch busbar 3 in advance. At the time of product characteristic inspection, after the branch busbar 3 is electrically connected to the main busbar B, a test current is applied, correction coefficients and correction formulas are set in the magnetic field strength arithmetic formula, the branch current arithmetic formula, and the detected current arithmetic formula based on the first resistance value and the second resistance value to correct errors between theoretical values and actual measured values. Afterwards, the correction coefficients and the correction formulas are stored to the storage part 5B. The test current is measured based on one or more values.

After the branch busbar 3 is electrically connected to the main busbar B, initialization based on the test current is performed, and with the first resistance value, the second resistance value, the correction coefficients, and the correction formulas being stored in the storage part 5B, the detected current can be accurately calculated based on the detection value of the detection part 4. After the initialization, the arithmetic part 5A may calculate the current value of the detected current Bi based on the detection value of the first magnetic field and the first resistance value, the second resistance value, and the corrected arithmetic formulas stored in the storage part 5B. With the above configuration, individual differences in the ratio of resistance values resulting from variations in the dimensions of the main busbar B and the branch busbar 3, which are metal members, can be corrected by the calculation of the arithmetic part 5A.

Figure 4:
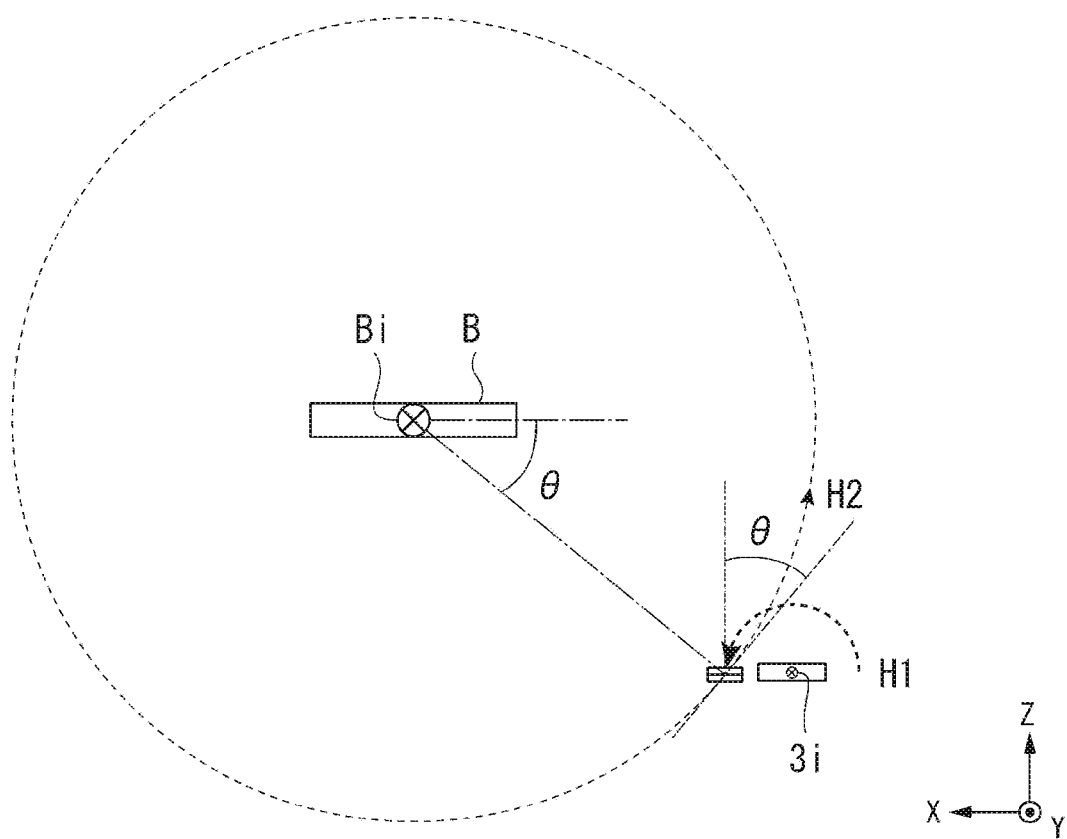
FIG. 4 is a view illustrating an arrangement relationship of a main busbar, a branch busbar, and a detection part according to the embodiment.

As illustrated in FIG. 4, the detection part 4 detects not only the first magnetic field H1 generated by the branch busbar 3, but also the component of a second magnetic field H2 generated by the main busbar B. In the case where the detected current Bi flowing through the main busbar B and the branch current 3*i* flowing through the branch busbar 3 flow in the same direction, the component of the second magnetic field H2 is, for example, expressed as a formula $H=I/2R \times \cos\theta$. In the formula, R is a spacing distance between the main busbar B and the detection part 4, and $\theta$ is a directional angle with respect to a height position of the main busbar B and a height position of the detection part 4. Thus, the closer $\theta$ is to 90°, the more capable the detection part 4 is of measuring the first magnetic field H1 without being affected by the second magnetic field H2. The detection part 4 may be arranged at a position where $\theta=90°$, for example.

Figure 5:
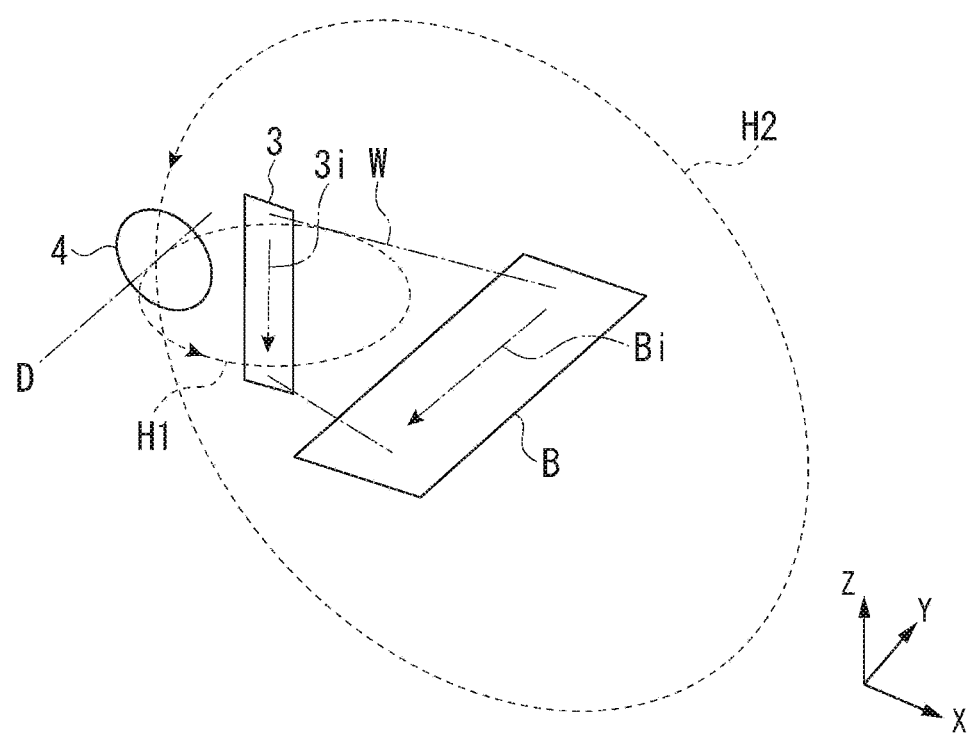
FIG. 5 is a view illustrating an arrangement relationship of the main busbar, the branch busbar, and the detection part according to the embodiment.

The detection part 4 may be arranged at a posture at which the detection part 4 does not detect the component of the second magnetic field in the detection direction D of the first magnetic field H1. Specifically, as illustrated in FIG. 5, the detection part 4 may be formed so that the normal direction of the surface of the semiconductor chip 2 is the detection direction D. The detection part 4 may be arranged, for example, at a posture and a position orthogonal, in the detection direction D, to the direction of the second magnetic field H2 generated by the detected current Bi, and may be arranged at a posture and a position at which the detection part 4 detects the first magnetic field H1 generated by the branch current 3*i*. Even in the case where the detection direction D of the detection part 4 is parallel to the surface of the semiconductor chip 2, the detection part 4 may be arranged at a posture and a position orthogonal, in the detection direction D, to the direction of the second magnetic field H2 generated by the detected current Bi, and may be arranged at a posture and a position at which the detection part 4 detects the first magnetic field H1 generated by the branch current 3*i*. In this embodiment, the detection part 4 is formed so that the normal direction of the surface of the semiconductor chip 2 is the detection direction D, but the embodiment is not limited thereto, and an in-plane direction of the surface of the semiconductor chip 2 may also be the detection direction D. In this case, the branch busbar 3 may be formed on the surface of the semiconductor chip 2, a vertical Hall element or the like in which the detection direction D is the in-plane direction may be formed in the semiconductor chip 2 immediately below the branch busbar 3, and the main busbar may be arranged adjacent to the semiconductor chip 2.

As described above, according to the current detection device 1, by electrically connecting to the main busbar B via the electrical wirings W, versatility can be achieved without depending on the shape and the mounting position of the main busbar B. According to the current detection device 1, it is possible to easily handle various types of the main busbar B, and it is possible to reduce the man-hours for development and production management and reduce costs. According to the current detection device 1, even if variations are present in the main busbar B or the product itself, at the time of product characteristic inspection, an inspection current can be measured to obtain the correction coefficients and the correction formulas for each individual product. By storing in the storage part 5B, the detected current can be accurately calculated, variations due to individual differences can be eliminated, and the accuracy can be improved.

According to the current detection device 1, the design work and design time can be reduced in a design which handles a large variety of products in small quantities, and design costs can be suppressed. According to the current detection device 1, processes such as setup time and parts management in the production stage are adjusted based on the design of the electrical wirings W and the data stored in the storage part 5B, so the man-hours for development and production management can be greatly reduced. According to the current detection device 1, it is possible to set a wide operating temperature range, such as motor control for hybrid and electric vehicles, idling control for battery monitoring, and motor control for electric power steering, and it is possible to apply to uses requiring non-contact detection of larger currents (several tens of amperes to hundreds of amperes).

Modification Example 1

Modification examples of the current detection device will be described below. In the following description, the same names and reference signs will be used for the same configurations, and repeated descriptions will be omitted as appropriate.

Figure 6:
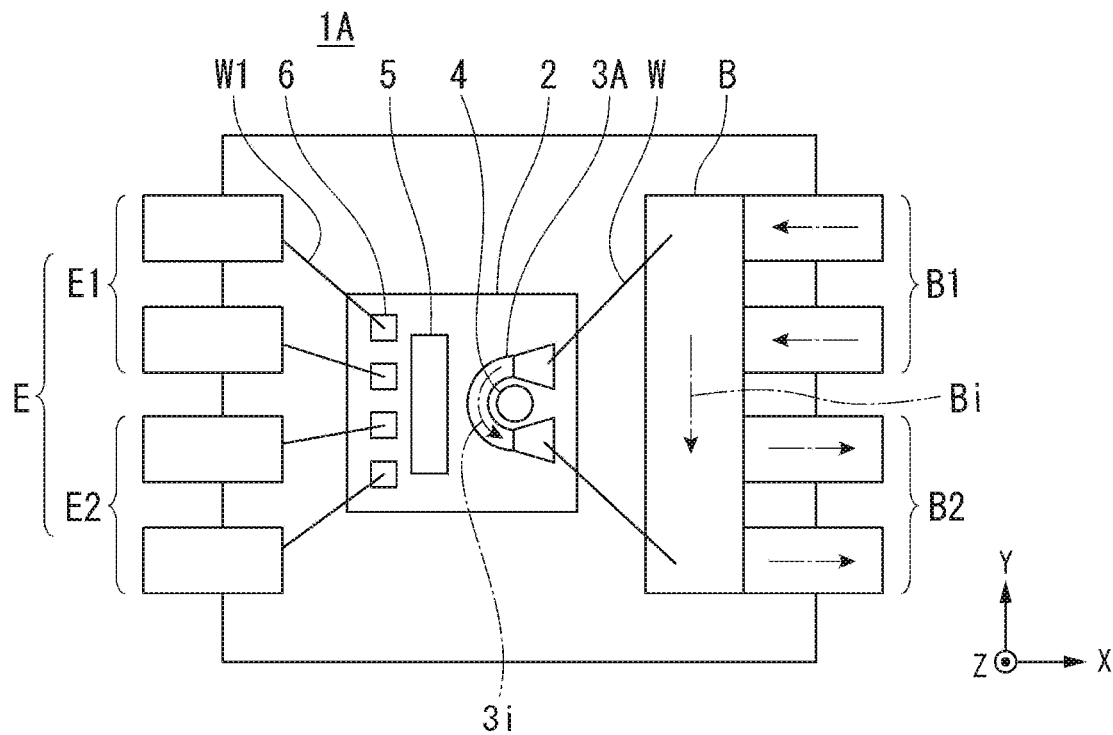
FIG. 6 is a plan view illustrating a current detection device according to a modification example 1.

As illustrated in FIG. 6, in a current detection device 1A according to a modification example 1, the detection sensitivity of the detection part 4 is improved. A branch busbar 3A is formed in an arch shape extending around the detection part 4, for example. A branch current 3*i* flows in an arch shape along the branch busbar 3A. According to the current detection device 1A, the strength of the first magnetic field H1 received by the detection part 4 is improved on the inner peripheral side of the branch busbar 3A compared to the case where the branch busbar 3 is used.

Modification Example 2

Figure 7:
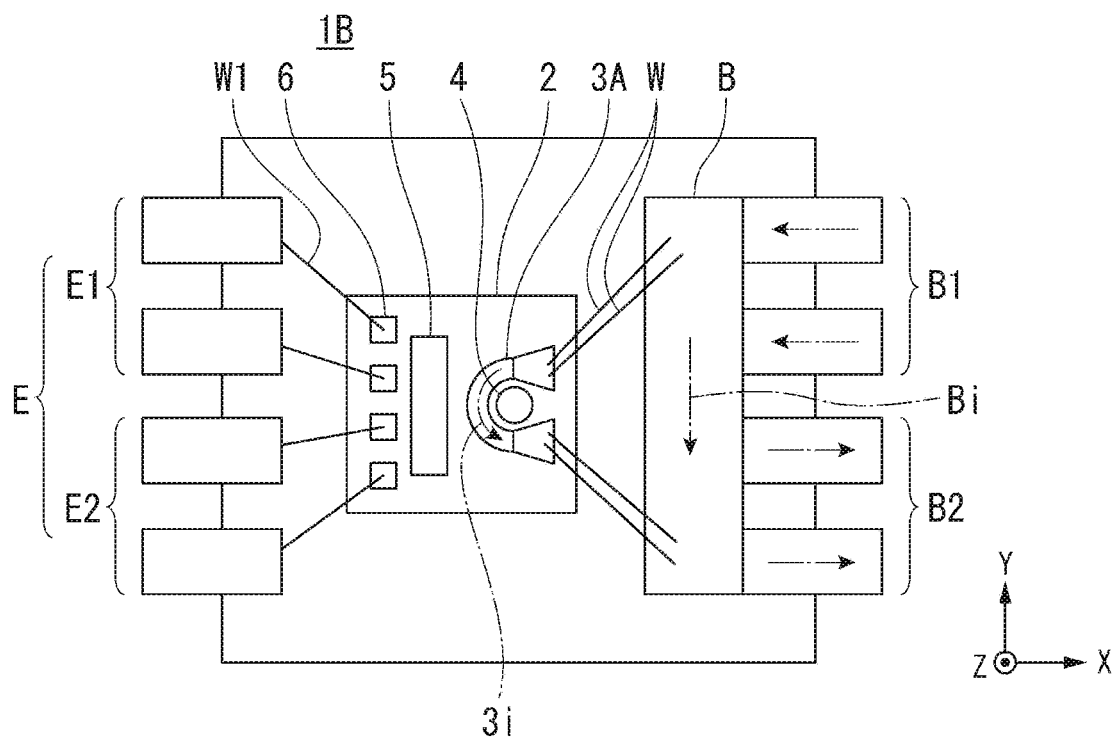
FIG. 7 is a plan view illustrating a current detection device according to a modification example 2.

As illustrated in FIG. 7, in a current detection device 1B according to a modification example 2, the wiring quantity of electrical wirings W electrically connecting the main busbar and the branch busbar in the current detection device 1A is different from that of the electrical wirings W of the above embodiment. Two or more electrical wirings W may be provided on one end side and another end side of the branch busbar 3A. In the current detection device 1B, the branch current 3i flowing through the branch busbar 3A may be adjusted based on the wiring quantity of electrical wirings W. Further, in the current detection device 1B, the branch current 3i flowing through the branch busbar 3A may be adjusted based on a cross-sectional diameter of the electrical wiring W. The change in the wiring quantity or the diameter of the electrical wirings W may also be applied to the current detection device 1.

Modification Example 3

Figure 8:
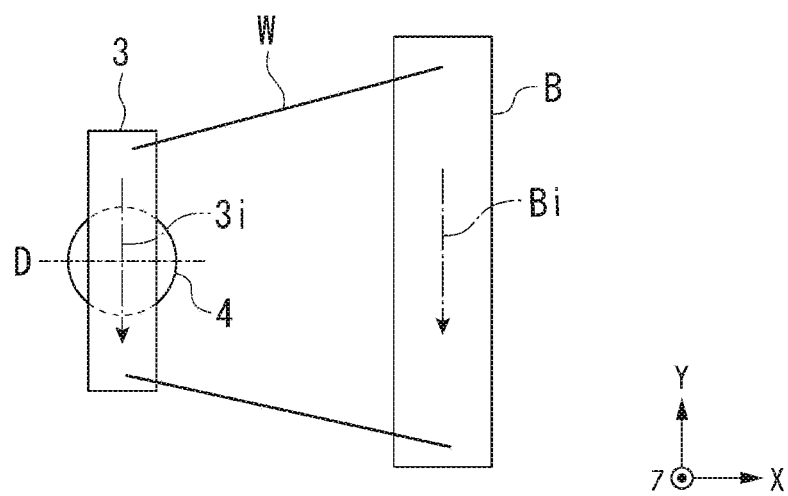
FIG. 8 is a plan view illustrating an arrangement relationship of a main busbar, a branch busbar, and a detection part according to a modification example 3.

As illustrated in FIG. 8, in the case where the detection direction D of magnetic field of the detection part 4 is parallel (the X-axis direction) to the surface of the semiconductor chip 2, the branch busbar 3 may be arranged to overlap the detection part 4. In this case, the main busbar B may be arranged adjacent to and parallel to the branch busbar 3.

Modification Example 4

Figure 9:
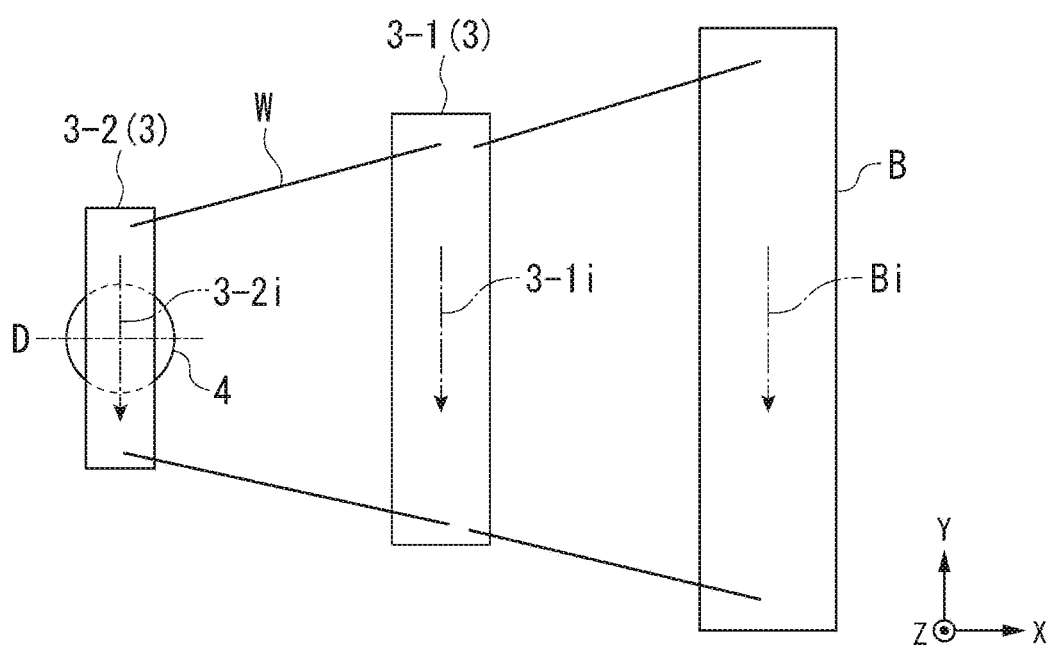
FIG. 9 is a plan view illustrating an arrangement relationship of a main busbar, a branch busbar, and a detection part according to a modification example 4.

As illustrated in FIG. 9, two or more branch busbars 3 of the current detection device 1 may be provided. The branch busbar 3 may include, for example, a first branch busbar 3-1 electrically connected in parallel to the main busbar B, and a second branch busbar 3-2 electrically connected in parallel to the first branch busbar 3-1. The detection part 4 may be arranged adjacent to the second branch busbar 3-2. With the above configuration, the degree of freedom of arrangement of the branch busbar 3 and the detection part 4 is improved in the current detection device 1.

In addition to the above modification examples, the semiconductor chip may include a wafer level package (WLP) wiring on its surface, and the branch busbar may be formed at the WLP wiring.

Although an embodiment of the present invention has been described above, the present invention is not limited to the above-described embodiment and may be modified as appropriate without departing from the scope thereof. Further, within the scope of the present invention, it is possible to appropriately replace the constituent elements in the above-described embodiment with known constituent elements, and the modification examples described above may be combined as appropriate.

What is claimed is:

1. A current detection device comprising:
a main busbar through which a detected current flows; and
a semiconductor chip spaced apart from the main busbar, wherein
the semiconductor chip comprises:
a branch busbar connected in parallel with the main busbar;
a detection part which is arranged adjacent to the branch busbar and detects a first magnetic field generated based on a branch current flowing from the main busbar to the branch busbar; and
an output part which calculates and outputs a current value based on the first magnetic field detected by the detection part.

2. The current detection device according to claim 1, wherein
the branch busbar is adjusted to a second resistance value higher than a first resistance value of the main busbar.

3. The current detection device according to claim 2, wherein
the branch busbar is adjusted to the second resistance value so that a temperature propagated to the detection part based on an amount of heat generated due to the branch current becomes lower than a temperature threshold value which ensures detection performance of the detection part.

4. The current detection device according to claim 1, wherein
the branch busbar is arranged to be spaced apart from the detection part by a predetermined distance or more so that a temperature propagated to the detection part based on an amount of heat generated due to the branch current becomes lower than a temperature threshold value which ensures detection performance of the detection part.

5. The current detection device according to claim 1, wherein
the main busbar generates a second magnetic field based on the detected current, and
the detection part is arranged at a posture or a position which makes it difficult to detect a component of the second magnetic field in a detection direction of the first magnetic field.

6. The current detection device according to claim 1, comprising:
an electrical wiring which is formed of a metal wire and electrically connects the main busbar and the branch busbar.

7. The current detection device according to claim 6, wherein
the branch current is adjusted based on a cross-sectional diameter or a wiring quantity of the electrical wiring.

8. The current detection device according to claim 1, wherein
the branch busbar comprises:
a first branch busbar electrically connected in parallel to the main busbar; and
a second branch busbar electrically connected in parallel to the first branch busbar, and
the detection part is arranged adjacent to the second branch busbar.

9. The current detection device according to claim 1, wherein
the semiconductor chip comprises a WLP wiring on a surface of the semiconductor chip, and
the branch busbar is formed at the WLP wiring.

* * * * *